United States Patent [19]

Bencuya

[11] Patent Number: 4,651,407
[45] Date of Patent: Mar. 24, 1987

[54] METHOD OF FABRICATING A JUNCTION FIELD EFFECT TRANSISTOR UTILIZING EPITAXIAL OVERGROWTH AND VERTICAL JUNCTION FORMATION

[75] Inventor: Izak Bencuya, San Jose, Calif.

[73] Assignee: GTE Laboratories Incorporated, Waltham, Mass.

[21] Appl. No.: 731,685

[22] Filed: May 8, 1985

[51] Int. Cl.[4] .................. H01L 21/20; H01L 21/76
[52] U.S. Cl. ............................ 29/571; 29/576 B;
  29/576 E; 29/576 W; 148/1.5; 148/175;
  148/187; 148/DIG. 26; 148/DIG. 88;
  148/DIG. 111; 156/612; 357/22; 357/49
[58] Field of Search ........ 148/1.5, 175, 187, DIG. 26,
  148/DIG. 88, DIG. 111; 29/571, 576 E, 576 B,
  576 W, 578, 580; 156/612; 357/22 D, 22 E, 49

[56] References Cited

U.S. PATENT DOCUMENTS

| 3,977,017 | 8/1976 | Ishitani | 357/22 E |
| 4,036,672 | 7/1977 | Kobayashi | 148/DIG. 88 |
| 4,115,793 | 9/1978 | Nishizawa | 357/22 E |
| 4,124,933 | 11/1978 | Nicholas | 29/578 |
| 4,326,209 | 4/1982 | Nishizawa et al. | 357/22 D |
| 4,378,629 | 4/1983 | Bozler et al. | 29/580 |
| 4,499,657 | 2/1985 | Ooga et al. | 29/576 E |
| 4,522,661 | 6/1985 | Morrison et al. | 148/DIG. 26 |

Primary Examiner—William G. Saba
Attorney, Agent, or Firm—David M. Keay

[57] ABSTRACT

Junction field effect transistor and method of fabrication. An epitaxial layer of high resistivity N-type silicon is grown on a substrate of low resistivity silicon. A layer of silicon dioxide is grown on the surface of the epitaxial layer and selectively removed to expose silicon in a pattern of a plurality of parallel surface areas with parallel strips of silicon dioxide in between. A second epitaxial layer is deposited over the exposed surface areas and the strips of silicon dioxide. Barriers of silicon dioxide are formed in the second epitaxial layer extending from the surface to adjacent to but spaced from the edges of the buried strips. P-type conductivity imparting material is implanted and then diffused into the zones of the second epitaxial layer defined by adjacent barriers and overlying the buried strips to form gate regions. Each gate region has portions extending laterally between the adjacent barriers and the underlying strip to form a gate junction between each portion and the N-type silicon of the second epitaxial layer. N-type conductivity imparting material is ion implanted into the intervening zones to form source regions. Metal contacts are applied to the gate regions, the source regions, and the substrate.

5 Claims, 6 Drawing Figures

METHOD OF FABRICATING A JUNCTION FIELD EFFECT TRANSISTOR UTILIZING EPITAXIAL OVERGROWTH AND VERTICAL JUNCTION FORMATION

BACKGROUND OF THE INVENTION

This invention relates to semiconductor devices. More particularly, it is concerned with junction field effect transistors of the static induction type and to methods of fabrication.

The static induction transistor is a field effect semiconductor device capable of operation at relatively high frequency and power. The transistors are characterized by a short, high resistivity semiconductor channel region which may be controllably depleted of carriers. The current-voltage characteristics of the static induction transistor are generally similar to those of a vacuum tube triode. These devices are described by Nishizawa et al in U.S. Pat. Nos. 3,828,230 issued Aug. 6, 1974 and 4,199,771 issued Apr. 22, 1980. See also an article entitled "High Performance Microwave Static Induction Transistors," by Cogan et al, published in the Proceedings of the International Electron Devices Meeting (IEEE), Dec. 5, 6, and 7, 1983, Washington, D.C., paper 9.5, page 221.

The static induction transistor generally uses vertical geometry with source and drain electrodes placed on opposite sides of a thin, high resistivity layer of one conductivity type. Gate regions of opposite conductivity type are positioned in the high resistivity layer on opposite sides of the source. During operation a reverse bias is applied between the gate region and the remainder of the high resistivity layer causing a depletion region to extend into the channel region below the source. As the magnitude of the reverse bias is varied, the source-drain current and voltage derived from an attached energy source will also vary.

One factor which affects the operation of static induction transistors at high frequencies is the gate-to-drain capacitance. This parameter affects both the output and the input capacitances when the devices are used in a common-source configuration. In addition the voltage gain and transconductance of a device are affected by the position of the gate depletion region with respect to the drain.

SUMMARY OF THE INVENTION

The method of fabricating a junction field effect transistor in accordance with the present invention provides an improved method of obtaining a static induction transistor having low gate-to-drain capacitance and precisely controlled voltage gain and transconductance.

The method in accordance with the present invention comprises providing a body of semiconductor material which includes a first layer of semiconductor material of one conductivity type of relatively high resistivity and a second layer of semiconductor material of the one conductivity type of relatively low resistivity contiguous with the first layer. The first layer has a surface at a surface of the body. A layer of a nonconductive protective material is formed at the surface of the body. The nonconductive protective material is selectively removed to expose the underlying first layer of semiconductor material in a pattern of a plurality of parallel surface areas with parallel strips of the nonconductive protective material interposed between the exposed surface areas. The strips of nonconductive protective material have edges adjacent to the exposed surface areas. An epitaxial layer of semiconductor material of the one conductivity type of relatively high resistivity is deposited on the layer of nonconductive protective material and the exposed parallel surface areas of the first layer. Barriers of nonconductive protective material are formed in portions of the epitaxial layer which overlie the edges of the strips of nonconductive protective material. The barriers of nonconductive protective material extend from the surface of the epitaxial layer and they are spaced from the underlying strips of nonconductive protective material. The portions of the epitaxial layer between adjacent barriers of nonconductive protective material and overlying the strips of nonconductive protective material are gate zones, and the intervening portions of the epitaxial layer between adjacent barriers of nonconductive protective material and overlying the previously exposed surface areas of the first layer are source zones. Conductivity type imparting material of the opposite conductivity type is introduced into the gate zones of the epitaxial layer at the surface thereof to convert regions of the epitaxial layer to the opposite conductivity type, thereby forming gate regions of the opposite conductivity type. Each of the gate regions has portions extending laterally between the adjacent barriers and the underlying strip of nonconductive protective material to form a gate junction between each of the portions of the gate region and semiconductor material of the one conductivity type of the epitaxial layer, each gate junction extending from a barrier of nonconductive protective material to a strip of nonconductive protective material. Source regions of the one conductivity type of relatively low resistivity are formed in regions of the source zones adjacent to the surface of the epitaxial layer. Conductive material is then applied to form electrical contacts in ohmic contact with the source and gate regions at the surface of the epitaxial layer.

A junction field effect transistor in accordance with the present invention comprises a body of semiconductor material including a first layer of semiconductor material and a second layer of semiconductor material of one conductivity type of relatively low resistivity contiguous with the first layer. The first layer has a surface at a surface for the body. A plurality of parallel barriers of nonconductive protective material extend into the first layer from the surface. Alternate portions of the first layer between adjacent barriers are gate zones, and the intervening portions of the first layer between adjacent barriers are source zones. A strip of semiconductor protective material underlies each of the gate zones. Each strip has edges underlying the adjacent barrier of nonconductive protective material and is spaced from the adjacent barriers. A plurality of gate regions of the opposite conductivity type are located in the first layer. Each of the gate regions extends from the surface of the first layer in a gate zone to the underlying strip of nonconductive protective material and has portions extending laterally between the adjacent barriers and the underlying strip to form a gate junction, each gate junction extending from a barrier of nonconductive protective material to a strip of nonconductive protective material. Each of the source zones has a source region of the one conductivity type of relatively low resistivity at the surface of the first layer. The first layer of semiconductor material other than the source regions and the gate regions is of the one conductivity type of relatively high resistivity. The regions of the one conductivity type of relatively high resistivity between adjacent gate junctions are channel regions.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with the above-described drawings.

DETAILED DESCRIPTION OF THE INVENTION

In fabricating junction field effect transistors of the static induction type in accordance with the invention as illustrated in the figures a substrate of single crystal semiconductor material of one conductivity type is provided as a supporting structure. As is well-understood the substrate is usually a slice or wafer of relatively large surface area upon which many identical devices are fabricated simultaneously. However, for purposes of illustration the fabrication of only a portion of a single static induction transistor in a fragment of a slice will be shown and described. In the following description silicon is employed as the semiconductor material and the substrate is of relatively low resistivity N-type conductivity.

Figure 1:
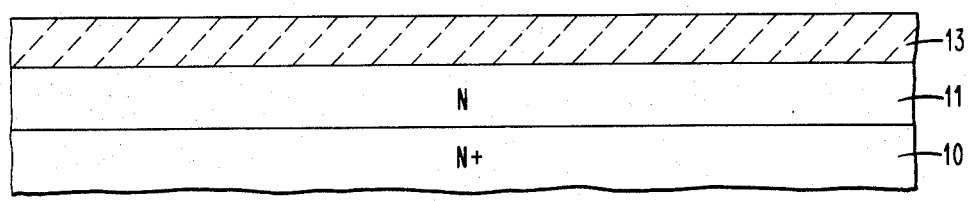
FIGS. 1-6 are a series of elevational views in cross-section of a fragment of a wafer of semiconductor material illustrating successive steps in the fabrication of a junction field effect transistor of the static induction type in accordance with the present invention.

A slice or wafer of N-type silicon of uniform, relatively low resistivity having flat, planar, parallel, opposed major surfaces, a fragment 10 of which is shown in FIG. 1, is produced by any of the known techniques of crystal fabrication including appropriate slicing and cleaning operations. An epitaxial layer 11 of N-type silicon of uniform, relatively high resistivity is grown on the surface of the substrate as by known vapor phase epitaxial deposition techniques. A layer 11 which is precisely controlled as to thickness and as to resistivity and which is a continuation of the crystalline structure of the single crystal substrate 10 is thus deposited on the surface of the substrate. The upper surface of the epitaxial layer 11 is parallel to the interface between the substrate and the layer. Next, the surface of the wafer is covered with an adherent protective layer of silicon dioxide 13.

Figure 2:
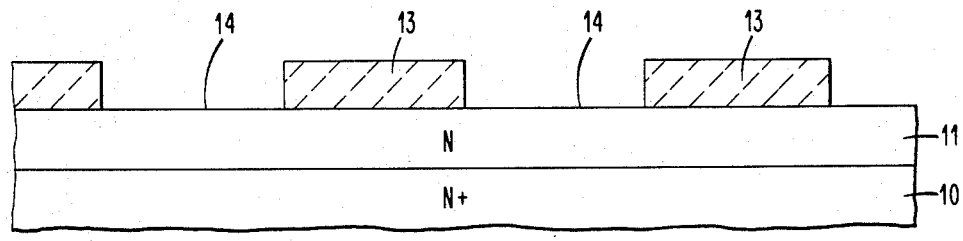

By employing standard photoresist masking and etching techniques portions of the silicon dioxide layer 13 are selectively removed as illustrated in FIG. 2. The silicon dioxide is removed to expose a pattern of a plurality of parallel surface areas 14 with parallel strips of the silicon dioxide layer 13 interposed between the exposed surface areas.

Figure 3:
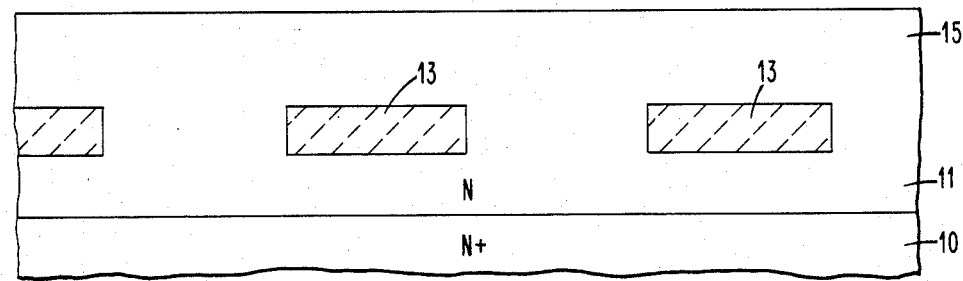

Next, as illustrated in FIG. 3 a layer of silicon 15 is epitaxially deposited on the silicon dioxide layer 13 and the exposed surface areas of the first epitaxial layer 11. The epitaxial layer 15 is of the same resistivity as the underlying epitaxial layer 11 and forms a continuation of its single crystal structure. The single crystal epitaxial layer 15 starts at the exposed silicon surfaces 14 and grows laterally around the silicon dioxide strips 13 to produce a flat, planar upper surface which is parallel to the interface between the substrate 10 and the epitaxial layer 11.

Figure 4:
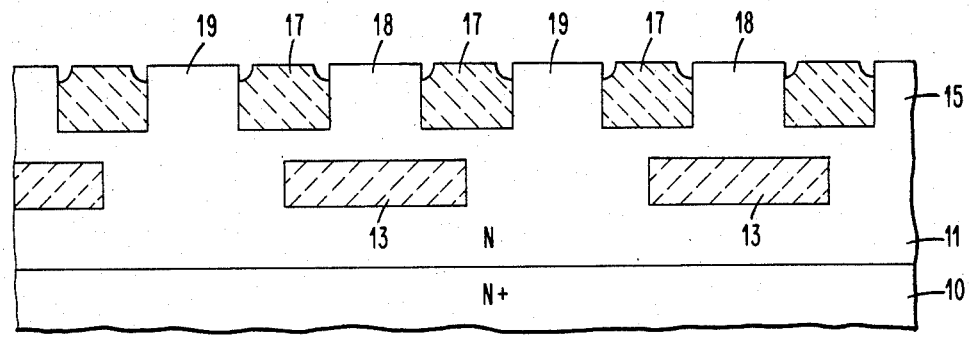

Next, as illustrated in FIG. 4 barriers of silicon dioxide 17 are formed in the upper epitaxial silicon layer 15. The barriers 17 may be produced as by the known technique of appropriately masking the surface of the wafer with silicon nitride and then exposing the wafer to oxygen at an elevated temperature to form localized regions of thick silicon dioxide. An improved technique for forming the barriers 17 of silicon dioxide by etching grooves in the silicon body to a desired depth and, with appropriate masking, growing silicon dioxide from the bottom of the grooves is described and claimed in application Ser. No. 06/729,025 filed 4-30-85 entitled "Junction Field Effect Transistor and Method of Fabricating" by Izak Bencuya and Adrian I. Cogan and assigned to the assignee of the present application.

The barriers 17 are located over the edges of the underlying silicon dioxide strips 13 and extend vertically to within a desired distance from the strips 13. The barriers 17 divide the epitaxial layer 15 into a series of zones. Alternate zones 18 which overlie strips 13 of silicon dioxide are gate zones, and the intervening zones 19 between the gate zones 18 which overlie the previously exposed surface areas of the lower epitaxial layer 11 are source zones.

Figure 5:
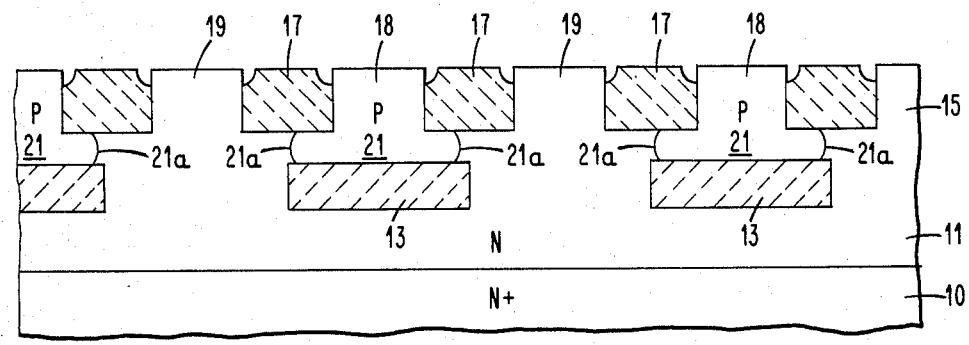

A layer of photoresist material is applied to the surface of the wafer and then selectively removed to expose the surfaces of the gate zones 18. P-type conductivity imparting material is then introduced into the silicon at the exposed surfaces of the gate zones by conventional ion implantation techniques. After ion implantation the photoresist material is removed. The wafer is heated to cause the implanted conductivity type imparting material in each gate zone to diffuse vertically downward from the surface and then laterally between the adjacent barriers 17 and the silicon dioxide strip 13. As illustrated in FIG. 5, gate regions of P-type conductivity 21 are thus produced in the high resistivity N-type material of the epitaxial layer 15. Portions 21a of each gate region 21 extend beneath the adjacent barriers 17 and over the silicon dioxide strip 13. A gate junction extending vertically from a barrier 17 to a strip 13 is thus formed at the junction of each portion 21a of a gate region 21 with the N-type silicon of the layer 15.

Figure 6:
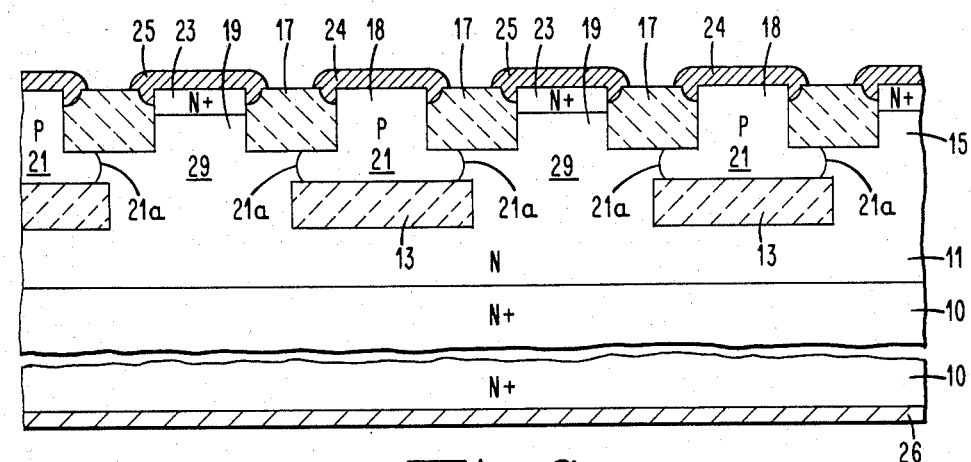

Next, a layer of photoresist material is placed on the surface of the wafer and selectively removed to expose the surfaces of the source zones 19. The wafer is subjected to treatment in a conventional ion implantation apparatus to implant N-type conductivity material into regions 23 at the upper surface of the source zones 19 as illustrated in FIG. 6. The photoresist layer is then removed and the wafer is annealed in order to activate the implanted ions.

A layer of metal, specifically aluminum, is applied to the entire surface of the wafer. The metal layer is appropriately masked and etched to provide the gate and source contact members 24 and 25 in ohmic contact with the surface areas of the gate and source zones 18 and 19, respectively. The gate contacts 24 are appropriately connected together and to a gate bonding pad (not shown) and the source contacts 25 are appropriately connected together and to a source bonding pad (not shown) in a conventional manner. A metal layer 26 is applied to the bottom surface of the substrate 10 in order to provide a suitable drain contact member.

The resulting junction field effect transistor (JFET) of the static induction transistor type as illustrated in FIG. 6 includes source regions 23 of low resistivity N-type silicon in the source zones 19 and a drain region of low resistivity N-type silicon provided by the substrate 10. Channel regions 29 of high resistivity N-type silicon between each source region 23 and the drain region 10 lie between the laterally extending portions 21a of the P-type gate regions 21.

In the fabrication of an exemplary static induction transistor structure in accordance with the present invention the substrate 10 may be a slice of single crystal N-type silicon doped with antimony to provide a uniform resistivity of 0.01 to 0.05 ohms-centimeters. The N-type epitaxial layers 11 and 15 of relatively high resistivity silicon are doped with arsenic during deposition to provide a uniform resistivity of about 15 ohm-centimeters. The epitaxial layer 11 may be about 8 micrometers thick. The silicon dioxide layer 13 is about 1 micrometer thick and the epitaxial layer 15 is about 2 micrometers thick. The silicon dioxide barriers 17 extend to a depth of about ½ micrometer so that the gate junctions have a vertical width of about ½ micrometer. The P-type gate regions 21 are formed by ion implanting and then diffusing boron into the wafer. Arsenic is implanted to form the N-type source regions 23.

As illustrated by the portion of the final device illustrated in FIG. 6 a static induction transistor as fabricated in accordance with the foregoing method has a relatively large gate-to-source distance, and consequently a relatively small gate-to-source capacitance, by virtue of the vertical displacement of the gate junctions from the surface due to the intervening silicon dioxide barriers 17. The configuration of the gate regions including the surface area of the gate junctions is determined by the positions of the non-conductive buried strips 13 and the nonconductive barriers 17. By controlling the vertical width of the barriers 17 the gate junctions may be made as narrow as desired. By making the vertical width of the gate junction very small, of the order of a few hundred angstroms, a very thin potential barrier is formed in the channel region 29 below the source 23 when voltage is applied to the gate. Further, by appropriately selecting the depth of the barriers 17 and the location of the buried strips 13, the vertical position of the gate junction and, therefore, of the potential barrier, may be precisely determined. This flexibility permits the voltage gain and transconductance to be adjusted precisely providing improved performance as to high frequency response and high power output.

While there has been shown and described what is considered a preferred embodiment of the present invention, it will be obvious to those skilled in the art that various changes and modifications may be made therein without departing from the invention as defined by the appended claims.

What is claimed is:

1. The method of fabricating a junction field effect transistor comprising providing a body of semiconductor material including a first layer of semiconductor material of one conductivity type of relatively high resistivity and a second layer of semiconductor material of the one conductivity type of relatively low resistivity contiguous with said first layer, said first layer having a surface at a surface of the body;

forming a layer of a nonconductive protective material at said surface;

selectively removing nonconductive protective material of said layer to expose said underlying first layer of semiconductor material in a pattern of a plurality of parallel surface areas with parallel strips of said nonconductive protective material interposed therebetween, said strips having edges adjacent to the exposed surface areas;

depositing an epitaxial layer of semiconductor material of the one conductivity type of relatively high resistivity on said layer of nonconductive protective material and the exposed parallel surface areas of said first layer;

forming barriers of nonconductive protective material in portions of said epitaxial layer overlying the edges of said strips of nonconductive protective material, said barriers of nonconductive protective material extending from the surface of said epitaxial layer and being spaced from the underlying strips of nonconductive protective material;

the portions of said epitaxial layer between adjacent barriers of nonconductive protective material and overlying said strips of nonconductive protective material being gate zones, and the intervening portions of said epitaxial layer between adjacent barriers of nonconductive protective material and overlying the previously exposed surface areas of said first layer being source zones;

introducing conductivity type imparting material of the opposite conductivity type into said gate zones of said epitaxial layer at the surface thereof to convert regions of said epitaxial layer to said opposite conductivity type thereby forming gate regions of the opposite conductivity type, each of said gate regions having portions extending laterally between the adjacent barriers and the underlying strip of nonconductive protective material to form a gate junction between each of said portions of the gate region and semiconductor material of the one conductivity type of the epitaxial layer, each gate junction extending from a barrier of nonconductive protective material to a strip of nonconductive protective material;

forming source regions of the one conductivity type of relatively low resistivity in regions of said source zones adjacent to the surface of the epitaxial layer; and applying conductive material to form electrical contacts in ohmic contact with said source and gate regions at the surface of said epitaxial layer.

2. The method in accordance with claim 1 wherein said semiconductor material is silicon; and
said nonconductive protective material is silicon dioxide.

3. The method in accordance with claim 2 wherein introducing conductivity type imparting material of the opposite conductivity type into said gate zones includes ion implanting conductivity type imparting material of the opposite conductivity type into the gate zones at the surface of the epitaxial layer; and heating to diffuse the ion implanted conductivity type imparting material of the opposite conductivity type into said gate regions.

4. The method in accordance with claim 3 wherein providing a body of semiconductor material includes providing a substrate of semiconductor material of the one conductivity type of relatively low resistivity having flat, planar, parallel, opposed major surfaces; and depositing an epitaxial layer of semiconductor material of the one conductivity type of relatively high resistivity of uniform thickness on a major surface of said substrate.

5. The method in accordance with claim 4 wherein forming source regions of the one conductivity type of relatively low resistivity includes
ion implanting conductivity type imparting material of the one conductivity type into said source zones at the surface of said epitaxial layer.

* * * * *